United States Patent
Nakagawa

(10) Patent No.: US 10,204,780 B2
(45) Date of Patent: Feb. 12, 2019

(54) IMPRINT APPARATUS, AND ARTICLE MANUFACTURING METHOD

(71) Applicant: CANON KABUSHIKI KAISHA, Tokyo (JP)

(72) Inventor: Kazuki Nakagawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/255,454

(22) Filed: Sep. 2, 2016

(65) Prior Publication Data

US 2017/0066177 A1    Mar. 9, 2017

(30) Foreign Application Priority Data

Sep. 8, 2015  (JP) ................. 2015-176277
Jun. 20, 2016  (JP) ................. 2016-121509

(51) Int. Cl.

| | |
|---|---|
| *B29C 59/02* | (2006.01) |
| *H01L 21/027* | (2006.01) |
| *B33Y 10/00* | (2015.01) |
| *B33Y 40/00* | (2015.01) |
| *B29C 64/386* | (2017.01) |
| *G03F 7/00* | (2006.01) |
| *B29L 31/34* | (2006.01) |
| *B29C 43/34* | (2006.01) |

(52) U.S. Cl.

CPC ........ *H01L 21/0271* (2013.01); *B29C 64/386* (2017.08); *B33Y 10/00* (2014.12); *B33Y 40/00* (2014.12); *G03F 7/0002* (2013.01); *B29C 2043/3427* (2013.01); *B29L 2031/34* (2013.01)

(58) Field of Classification Search

CPC ....... B29C 64/10; B29C 64/20; B29C 64/364; B29C 64/371; B33Y 10/00; B33Y 30/00; B33Y 40/00
USPC ......................................... 425/371
See application file for complete search history.

(56) References Cited

U.S. PATENT DOCUMENTS

| 9,682,424 | B2 * | 6/2017 | Mironets | ............... B22F 1/0085 |
| 2016/0045981 | A1 * | 2/2016 | Zurecki | ................ B23K 26/342 |
| | | | | 219/76.12 |

FOREIGN PATENT DOCUMENTS

| CN | 103341625 A | * 10/2013 |
| JP | 2014056854 A | 3/2014 |

* cited by examiner

*Primary Examiner* — Joseph S Del Sole
*Assistant Examiner* — Thu Khanh T Nguyen
(74) *Attorney, Agent, or Firm* — Rossi, Kimms & McDowell LLP

(57) ABSTRACT

Provided is an imprint apparatus that includes a supplying device configured to supply an imprint material to an imprint region on a substrate; a driving device configured to perform driving for bringing a mold into contact with the imprint material supplied to the imprint region; and a sealing device configured to seal the imprint region by forming a flow of gas, wherein the supplying device includes a member having a surface facing the substrate, an inlet port through which the gas flows into the member and an outlet port through which the gas flows out of the member are formed in the surface, and a flow path for connecting the inlet port with the outlet port is formed in the member.

18 Claims, 7 Drawing Sheets

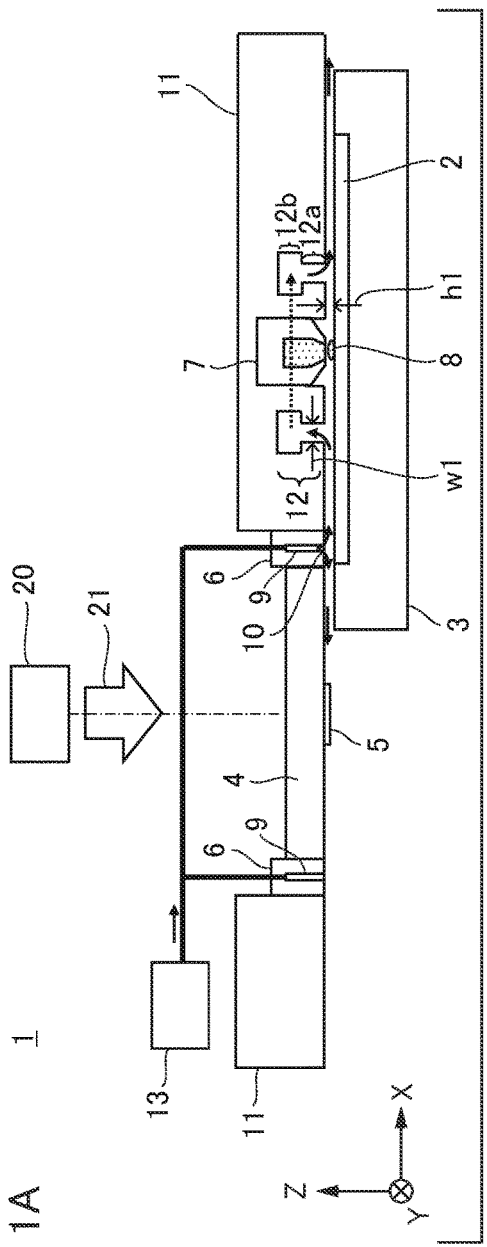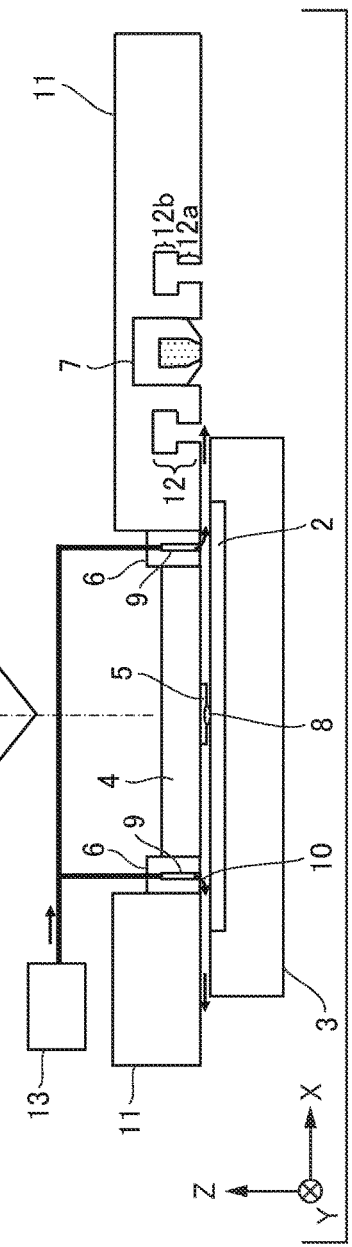
FIG. 1A
FIG. 1B

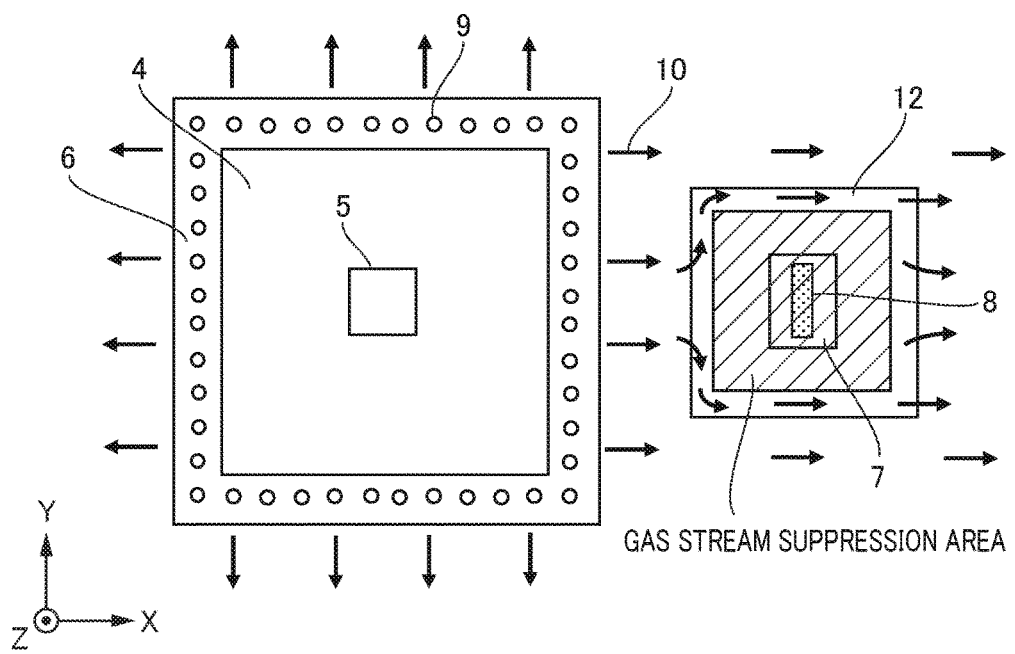

IMPRINT APPARATUS, AND ARTICLE MANUFACTURING METHOD

BACKGROUND OF THE INVENTION

Field of the Invention

The present invention relates to an imprint apparatus, and an article manufacturing method.

Description of the Related Art

There are imprint techniques that mold an imprint material on a substrate to form a pattern on the substrate. One example of such imprint techniques includes a photo-curing method. An imprint apparatus using the method brings a mold into contact with an imprint material on a substrate so as to fill the imprint material into the mold. The imprint material is cured by irradiation of light, and then the mold is released from the cured imprint material to thereby form a pattern on a substrate. Here, if foreign matters are deposited on a substrate or a mold, defects may occur on the pattern or may cause damage to the mold.

Japanese Patent Laid-Open No. 2014-56854 discloses an imprint apparatus that reduces foreign matters within the imprint region by surrounding (sealing) the imprint region with a gas curtain.

However, the imprint apparatus disclosed in Japanese Patent Laid-Open No. 2014-56854 may be disadvantageous for accurately supplying the imprint material to the imprint region if a gas stream caused by the gas curtain occurs beneath the imprint material supplying device.

SUMMARY OF THE INVENTION

The present invention provides, for example, an imprint apparatus advantageous in supplying of an imprint material in an imprint region accurately.

The present invention provides an imprint apparatus which is characterized in that it includes a supplying device configured to supply an imprint material to an imprint region on a substrate; a driving device configured to perform driving for bringing a mold into contact with the imprint material supplied to the imprint region; and a sealing device configured to seal the imprint region by forming a flow of gas, wherein the supplying device includes a member having a surface facing the substrate, an inlet port through which the gas flows into the member and an outlet port through which the gas flows out of the member are formed in the surface, and a flow path for connecting the inlet port with the outlet port is formed in the member.

Further features of the present invention will become apparent from the following description of exemplary embodiments with reference to the attached drawings.

BRIEF DESCRIPTION OF THE DRAWINGS

FIG. 1A is a diagram illustrating a configuration of an imprint apparatus according to a first embodiment.

FIG. 1B is a diagram illustrating a configuration of the imprint apparatus according to the first embodiment.

FIG. 2 is a diagram illustrating a flow of gas within the imprint apparatus according to the first embodiment as viewed from the positive direction side of the Z-axis direction.

DESCRIPTION OF THE EMBODIMENTS

Figure 3:
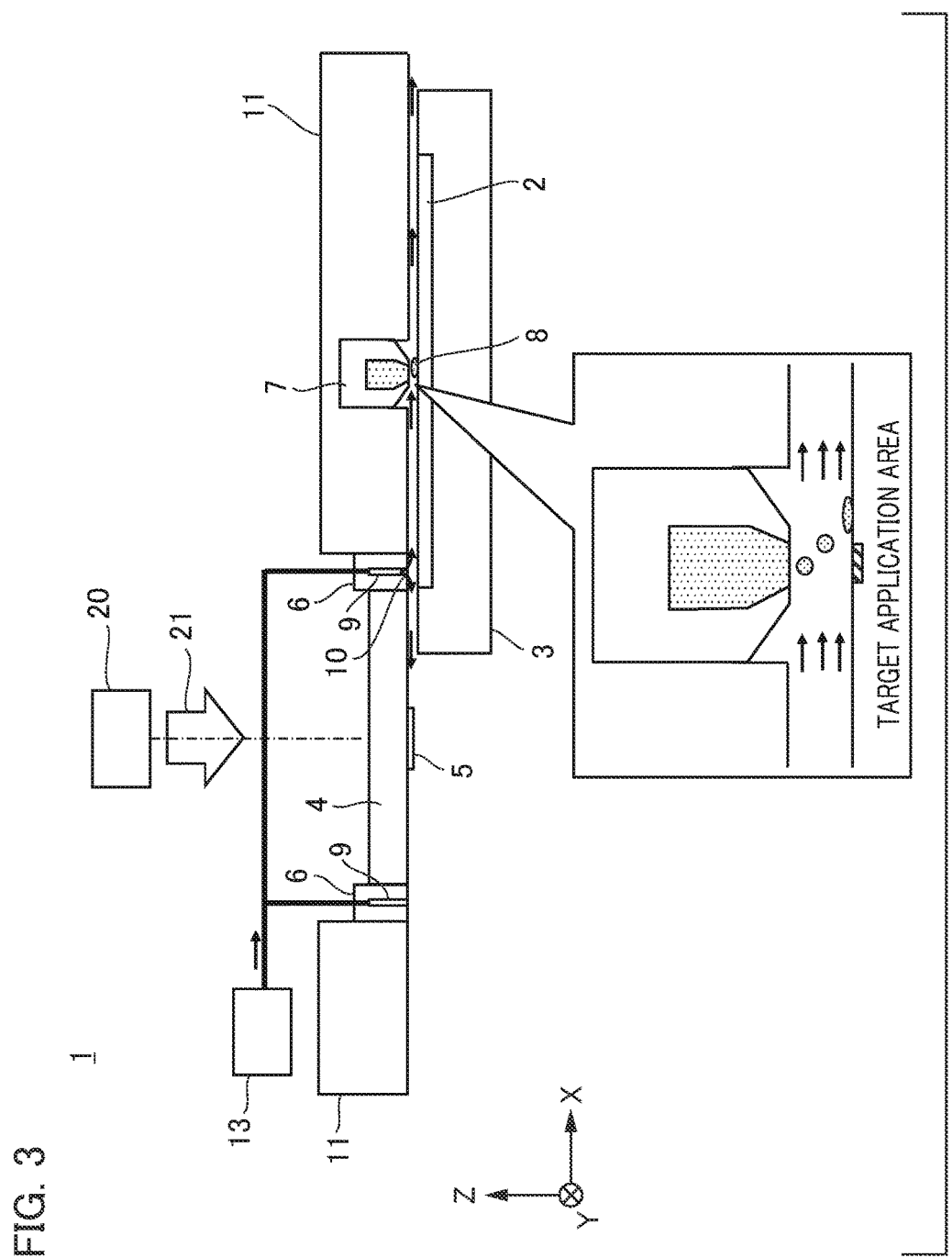
FIG. 3 is a diagram illustrating a flow of gas when no groove structure is provided according to the first embodiment.

Hereinafter, preferred embodiments of the present invention will be described with reference to the attached drawings.

First Embodiment

Each of FIGS. 1A and 1B is a diagram illustrating a configuration of an imprint apparatus according to the first embodiment of the present invention. An imprint apparatus 1 includes a light irradiating unit 20, a substrate stage 3, a mold holder 6, a supplying device 7, and a sealing device 13. FIG. 1A shows a state where a substrate 2 is located below the supplying device 7. FIG. 1B shows a state where the substrate 2 is located below a mold 4. In the present embodiment, a UV-curing type imprint apparatus is used as an imprint apparatus employing the photo-curing method. The method for curing an imprint material is not limited to curing using ultraviolet light but may be cured by irradiation of light of the other wavelength or may also be cured by exposure to other energy sources (e.g., heat). In the following drawings, a description will be given where the Z-axis is aligned parallel to the optical axis of an irradiation system that irradiates a resin on a substrate with ultraviolet light, and mutually orthogonal axes X and Y are aligned in a plane perpendicular to the Z-axis.

The light irradiating unit 20 irradiates the substrate 2 (mold 4) with ultraviolet light 21. The mold 4 consists of a material (such as quartz) through which the ultraviolet light 21 can be transmitted and has a pattern portion 5 such that the concave and convex pattern of a circuit pattern or the like which is three-dimensionally formed on the surface facing the substrate 2.

The substrate stage 3 holds the substrate 2 and performs alignment between the mold 4 and the resin 8 (the substrate 2) when the mold 4 is brought into contact with the resin (imprint material) 8. Alignment is performed by a stage driving mechanism (not shown) that can move the substrate stage 3 in the respective axis directions. The substrate 2 is a single crystal silicon substrate, a SOI (Silicon on Insulator) substrate, or the like.

The stage driving mechanism (not shown) may be constituted by a plurality of driving systems such as a coarse movement driving system, a fine movement driving system, and the like in the X-axis and Y-axis directions. Also, the stage driving mechanism may also have a driving system for adjusting the position of the substrate 2 in the Z-axis direction, a position adjustment function for adjusting the position of the substrate 2 in the θ direction, a tilt function for correcting the tilt of the substrate 2, and the like.

The mold holder 6 holds the mold 4 by suctioning or attracting the outer peripheral region of the surface of the mold 4 to be irradiated with the ultraviolet light 21 using a vacuum suction force or an electrostatic force. Upon completion of alignment between the mold 4 and the substrate 2, a driving device (not shown) provided in the mold holder 6 brings the mold 4 into contact with the imprint material 8 on the substrate 2 so as to move the mold 4 such that the imprint material 8 is released from the mold 4 after curing of the imprint material 8. In this manner, a pattern corresponding to the pattern portion 5 is formed on the substrate 2. As in the stage driving mechanism, the mold holder 6 may also include a plurality of driving systems and the like. It should be noted that contact and release between the mold 4 and the imprint material 8 are performed by moving at least either one of the mold 4 or the substrate 2.

The supplying device 7 includes a member 11 (facing part) having a surface facing the substrate 2. The supplying device 7 is disposed in the vicinity of the mold holder 6 so as to supply an imprint material 8 to an imprint region on the substrate 2. The imprint material 8 is a photo-curable resin which is cured by the ultraviolet light 21 and is selected by various conditions such as a semiconductor device manufacturing step or the like. The amount of the imprint material 8 to be supplied by the supplying device 7 is determined by the desired thickness of the imprint material 8 to be formed on the substrate 2, the density of a pattern to be formed, or the like.

FIG. 2 is a diagram illustrating the flow of gas 10 as viewed from the positive direction side of the Z-axis direction. As shown in FIGS. 1A, 1B and 2, the sealing device 13 forms a flow (gas curtain) caused by the gas 10 via first nozzles 9 so as to seal the imprint region. This allows to reduce foreign matters within the imprint region. The first nozzles 9 are provided in the mold holder 6 so as to surround the periphery of the mold 4.

The member 11 includes an opening 12a having an opening width w1 and a groove structure 12 including a flow path 12b. The opening 12a serves as an inlet port through which the gas 10 flows in or an outlet port through which the gas 10 flows out. The opening width w1 and the distance h1 between the substrate 2 and the member 11 have a certain magnitude relationship. The details of which will be described below. The flow path 12b is formed within the member 11 so as to connect the inlet port with the outlet port.

FIG. 3 is a diagram illustrating the flow of the gas 10 when the member 11 does not have the groove structure 12. As shown in FIG. 2, the gas 10 forms a gas stream flowing in the X-axis positive direction in the space sandwiched between the substrate 2 and the member 11. The gas stream causes the imprint material 8, which has been dropped by the supplying device 7 to be supplied on the substrate 2, to be flown in the X-axis positive direction, resulting in difficulty in accurately supplying the imprint material 8 to a target area on the substrate 2.

According to the groove structure 12 provided in the member 11 of the present embodiment, the gas stream flowing in the space sandwiched between the substrate 2 and the member 11 along the X-axis positive direction preferentially flows into the groove structure 12 rather than directly below the supplying device 7. This allows to suppress the gas stream to be formed directly below the supplying device 7.

As shown in FIGS. 1A, 1B and 2, the inlet port and the outlet port are connected via the flow path 12b, and thus the gas 10 flown in from the inlet port flows out from the outlet port. Thus, the flow rate of the gas 10 required for reducing foreign matters within the imprint region can be maintained. It should be noted that the opening width w1 of the opening 12a of the groove structure 12 may be, for example, a value which is equal to or less than twice the distance (gap) h1 between the substrate 2 and the member 11 and has the diversion or the bypass effect of a gas stream.

Figure 4:
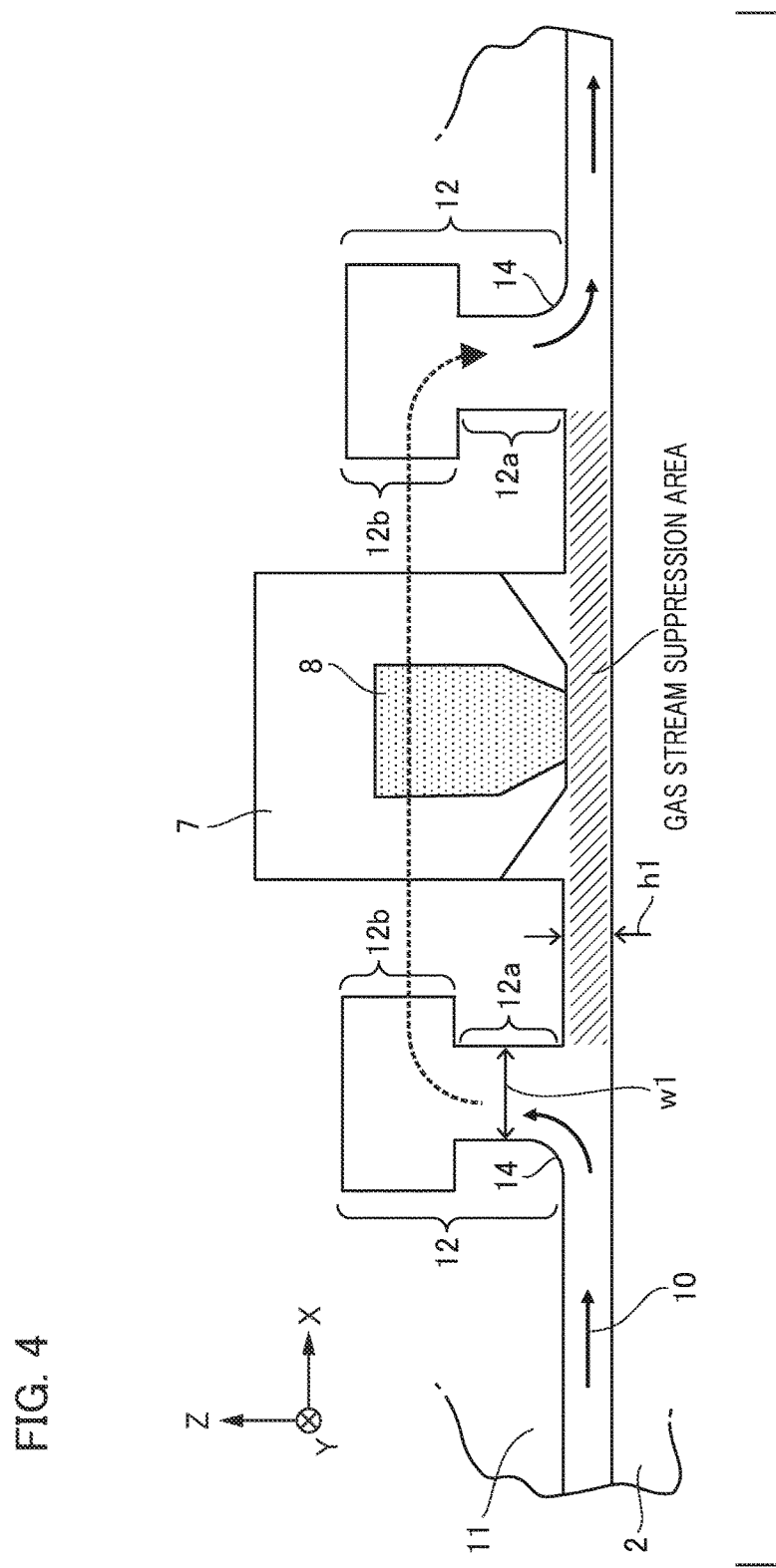
FIG. 4 is a diagram illustrating the details of a groove structure and the structure of a supplying device.

FIG. 4 is a diagram illustrating the details of the groove structure 12 and the structure of the supplying device 7. The opening 12a has a concave curved surface 14 toward a flow path 12b adjacent thereto (toward the inside of the opening 12a). The flow path 12b is configured to be bent with the curved surface 14 faced inward. The curved surface 14 may be squared or rounded. This permits the gas 10 flown in to be more readily drawn into the groove structure 12 and the gas 10 flown out to be more readily discharged toward the outside of the supplying device 7.

As described above, according to the present embodiment, an imprint apparatus that is advantageous for accurately supplying an imprint material to an imprint region may be provided.

Second Embodiment

Figure 5:
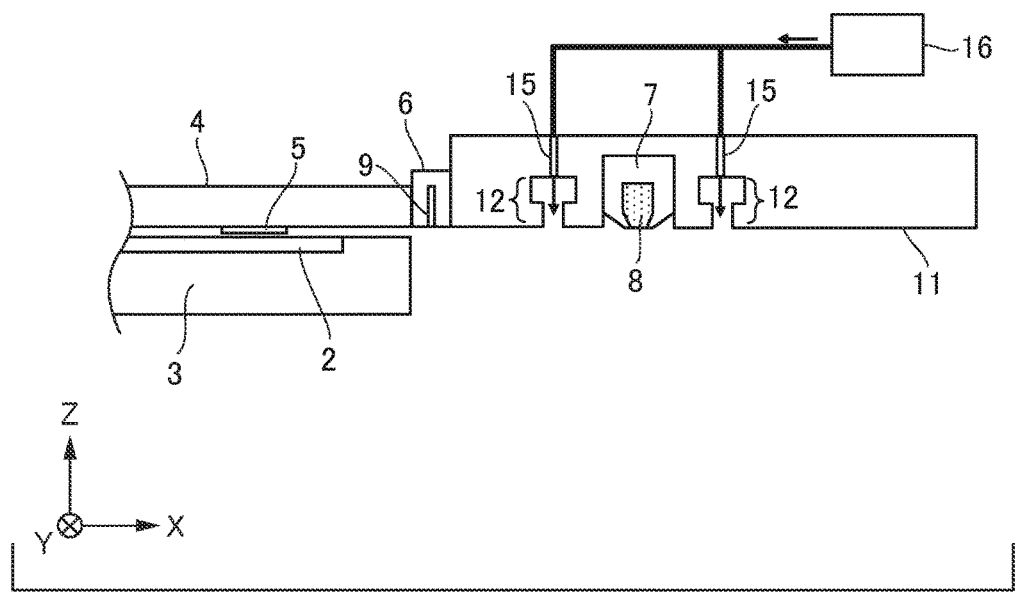
FIG. 5 is a diagram illustrating a configuration of a groove structure according to a second embodiment.

Next, a description will be given of an imprint apparatus according to a second embodiment of the present invention. The present embodiment is characterized in that a supply port 15 is formed in the flow path 12b. FIG. 5 is a diagram illustrating the groove structure 12 of the present embodiment. The groove structure 12 of the present embodiment has a gas supplying device 16 and a supply port 15. Since the shape of the groove structure 12 is complicated as compared with the member 11 around the same, foreign matters may easily remain on the inside (the flow path 12b) of the groove structure 12. The remained foreign matters are pushed out by the gas 10 flowing into the flow path 12b, and thus may be attached to the substrate 2. The remained foreign matters can be removed by flowing out gas from the inlet port or the outlet port via the supply port 15 from the gas supplying device 16.

Since no gas curtain is formed in a state where the substrate 2 is not located below the groove structure 12, foreign matters may enter into the inside of the groove structure 12. In this case, foreign matters can be prevented from being entered into the inside of the groove structure 12 by flowing out gas from the inlet port or the outlet port via the supply port 15 from the gas supplying device 16. While, in the present embodiment, a description has been given by taking an example in which the supply port 15 is disposed on an upper surface of the member 11, the supply port 15 may also be disposed on a side of the member 11. It may also be configured such that foreign matters are prevented from being entered into the inside of the groove structure 12 by using a gas stream supplied from the sealing device 13. According to the present embodiment, an imprint apparatus that is advantageous for accurately supplying an imprint material to an imprint region may also be provided.

The member 11 is disposed to face the substrate 2 within the range of motion of the substrate stage 3. Also, the first nozzles 9 is provided in the member 11 facing the substrate 2 within the range of motion of the substrate stage 3, so that the imprint region can be sealed with the first nozzles 9 of the member 11 even if the substrate stage 3 diverts from below the first nozzles 9 disposed around the mold 4.

By setting the opening width w1 of the opening 12a of the groove structure 12 to be wider than the distance (gap) h1 between the substrate 2 and the member 11, it becomes more likely that a gas stream flowing in the space sandwiched between the substrate 2 and the member 11 preferentially flows into the groove structure 12 exhibiting a small fluidic resistance (a large conductance).

Figure 6A:
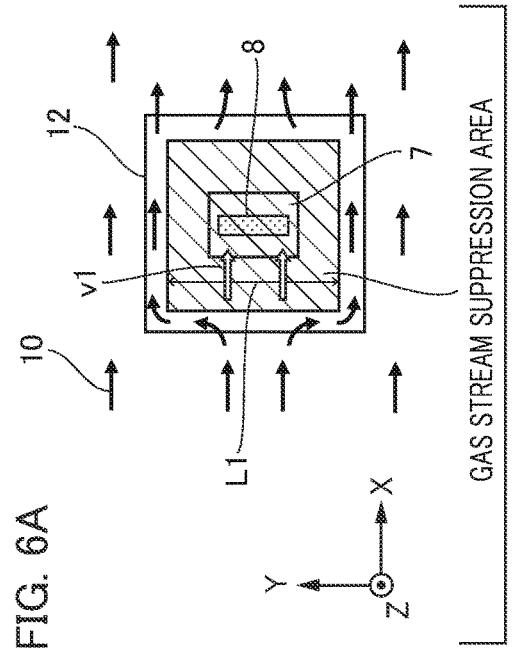
FIG. 6A is a diagram illustrating how readily gas flows into a groove structure.
Figure 6B:
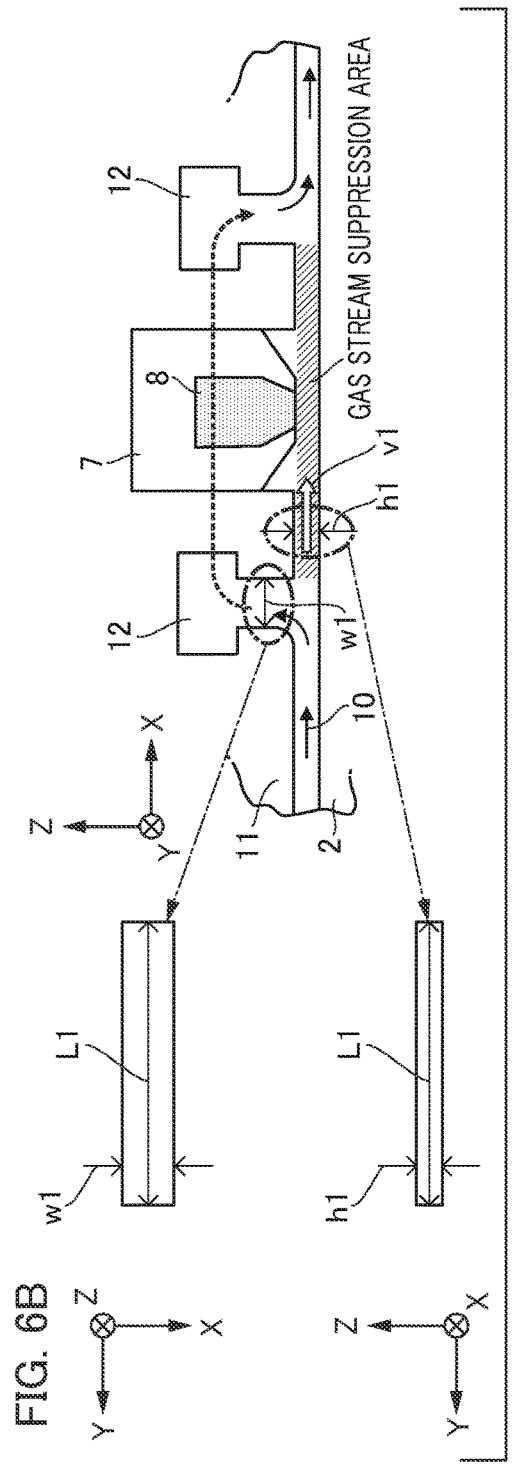
FIG. 6B is a diagram illustrating how readily gas flows into a groove structure.

While the above description has been focused only on the relationship between the opening width w1 and the gap h1 as to how gas readily flows into the groove structure 12, the following may be made by taking another dimension in the cross section of the flow path of the gas 10 into consideration. FIGS. 6A and 6B are diagrams illustrating how readily the gas 10 flows into the groove structure 12 by appending the length of the flow path cross section in the Y direction and the gas 10 flowing into below the supplying device 7 in FIGS. 2 and 4. Here, the length of the flow path cross section in the Y direction is defined as L1 and the gas 10 flowing into below the supplying device 7 is defined as the gas v1.

As shown in FIG. 6B, the cross-sectional area of the opening 12a parallel to the XY-plane is w1×L1. Also, the cross-sectional area of the illustrated gas stream suppression area including the area beneath the supplying device 7 in parallel to the YZ-plane is h1×L1. The gas 10 flowing in the X direction flows in the flow path having a larger cross-sectional area among the flow path subsequent to the opening 12a and the flow path subsequent to the gas stream suppression area. As compared to the case where no groove structure 12 is provided, the flow rate of the gas v1 can be reduced by 50% or more in the case where the groove structure 12 is provided. If the opening width w1 is expanded to twice the gap h1, the flow rate of the gas v1 can be reduced by 10% or more as compared to the case where no groove structure 12 is provided. Consequently, the amount of the area of the imprint material 8 supplied (dropped) from the supplying device 7 deviate from the target area on the substrate 2 can also be reduced by 10% or more.

Although the fluidic resistance of the flow path within the groove structure 12 can be reduced as the opening width w1 is expanded with respect to the gap h1, the volume within the groove structure 12 becomes too large if the opening width w1 is too expanded with respect to the gap h1. In this case, the gas 10 inherently required for forming a gas curtain flows too much into the groove structure 12, which upsets the balance of the flow rate of the gas curtain, resulting in a reduction in the effect of a gas curtain for preventing foreign matters from being entered.

If the opening width w1 exceeds ten times the gap h1, the harmful effects of disturbances to the formation of a gas curtain may become more serious than the benefits of improvement in the bypass effect of a gas stream. Thus, it is preferable that the opening width w1 be equal to or less than ten times the gap h1. It is more preferable that the opening width w1 be equal to or less than twice the gap h1 from the viewpoint of ensuring both the bypass effect of a gas stream and the effect of a gas curtain.

The aforementioned description based on the relationship between the opening width w1 and the gap h1 or based on the relationship between cross-sectional areas can be replaced with the description based on the relationship between fluidic resistances (conductance). In other words, the aforementioned description can be replaced with the description based on the relationship between the conductance of the flow path within the groove structure 12 and the conductance of the flow path across below (supply path) of the supplying device 7. For example, the conductance of the flow path within the groove structure 12 needs to be greater than the conductance of the flow path across below (supply path) of the supplying device 7. It should be noted that the former conductance is preferably equal to or less than ten times the latter conductance or is more preferably equal to or less than twice the latter conductance from the viewpoint of ensuring both the bypass effect of a gas stream and the effect of a gas curtain.

Figure 7A:
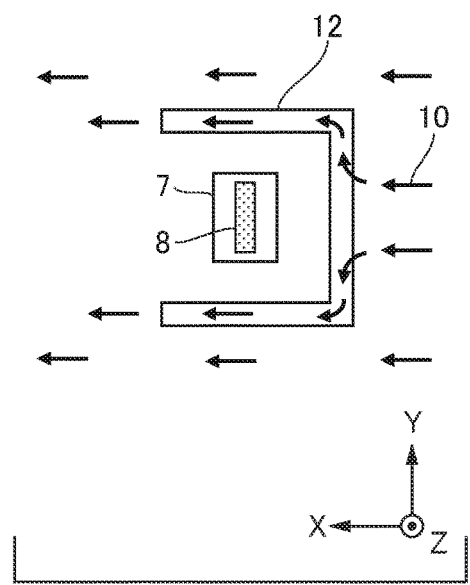
FIG. 7A is a diagram illustrating the shape of a groove structure as viewed from the +Z direction.
Figure 7B:
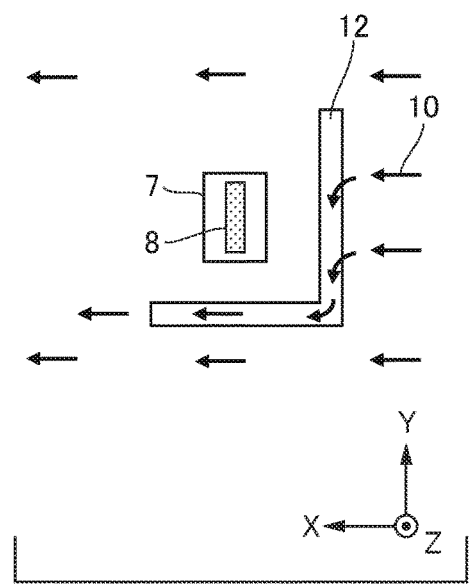
FIG. 7B is a diagram illustrating the shape of a groove structure as viewed from the +Z direction.

The groove structure 12 is formed around the supplying device 7 as shown in FIG. 2, so that the flow of the gas 10, of which the direction changes depending on the arrangement of the first nozzles 9 or the position of the substrate stage 3 movable within the range of motion thereof, below the supplying device 7 can be bypassed. It should be noted that the groove structure 12 may be partially interrupted instead of completely surrounding the supplying device 7. For example, as shown in FIGS. 7A and 7B, the groove structure 12 may be formed into a "C" shape so as to partially surround the supplying device 7 (the supply path) or may also be formed into a "L" shape so as to partially surround the supplying device 7 (the supply path). In other words, if it is sufficient to bypass only a gas stream coming from a particular direction, a sufficient bypass effect can be obtained by forming the groove structure 12 into such a shape so as to partially surround the supplying device 7 (the supply path).

(Device Manufacturing Method)

A method for manufacturing a device (semiconductor integrated circuit element, liquid display element, or the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When other articles such as a patterned medium (storage medium), an optical element, or the like are manufactured, the manufacturing method may include another step of processing the substrate on which a pattern has been formed instead of the etching step. The device manufacturing method of the present embodiment has an advantage, as compared with a conventional method, in at least one of performance, quality, productivity and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-176277 filed on Sep. 8, 2015, and Japanese Patent Application No. 2016-121509 filed on Jun. 20, 2016, which are hereby incorporated by reference herein in their entirety.

What is claimed is:

1. An imprint apparatus comprising:
   a stage configured to hold a substrate and be movable;
   a material supplying device configured to supply an imprint material in an imprint region on the substrate;
   a holder configured to hold a mold to be brought into contact with the imprint material supplied in the imprint region;
   a member including a surface facing the stage and disposed between the holder and the material supplying device; and
   a gas supplying device configured to form a flow of gas between the surface and the stage in a direction from the holder toward the material supplying device,
   wherein the member is formed with a flow path of the gas such that the gas is diverted from a supply path along which the material supplying device supplies the imprint material in the imprint region.

2. The imprint apparatus according to claim 1, wherein a conductance of the flow path is greater than a conductance of a flow path of gas across the supply path.

3. The imprint apparatus according to claim 1, wherein a conductance of the flow path is not greater than ten times a conductance of a flow path of the gas across the supply path.

4. The imprint apparatus according to claim 1, wherein a conductance of the flow path is not greater than twice a conductance of a flow path of the gas across the supply path.

5. A method of manufacturing an article, the method comprising steps of:
  forming a pattern on a substrate by using an imprint apparatus; and
  processing the substrate, on which the pattern has been formed, to manufacturing the article,
  wherein the imprint apparatus includes:
a stage configured to hold a substrate and be movable;
  a material supplying device configured to supply an imprint material in an imprint region on the substrate;
  a holder configured to hold a mold to be brought into contact with the imprint material supplied in the imprint region; and
  a member including a surface facing the stage and disposed between the holder and the material supplying device; and
  a gas supplying device configured to form a flow of gas between the surface and the stage in a direction from the holder toward the material supplying device,
  wherein the member is formed with a flow path of the gas such that the gas is diverted from a supply path along which the material supplying device supplies the imprint material in the imprint region.

6. An imprint apparatus comprising:
  a material supplying device configured to supply an imprint material in an imprint region on an substrate;
  a gas supplying device configured to form a flow of gas in a direction toward the material supplying device; and
  a member including a surface facing the substrate and disposed between the material supplying device and the gas supplying device,
  wherein the member is formed with a flow path of the gas such that the gas is diverted from a supply path along which the material supplying device supplies the imprint material in the imprint region.

7. A The imprint apparatus according to claim 6, wherein an inlet port through which the gas flows into the member and an outlet port through which the gas flows out of the member are formed in the surface, and a flow path for connecting the inlet port with the outlet port is formed in the member.

8. The imprint apparatus according to claim 7, wherein the opening width of the inlet port or the outlet port or each thereof is not greater than twice a distance between the material supplying device and the substrate.

9. The imprint apparatus according to claim 7, wherein the member has, adjacent to the inlet port, a curved surface convex toward the flow path, and is configured such that the flow path is bent with the curved surface inside.

10. The imprint apparatus according to claim 7, wherein the member has, adjacent to the outlet port, a curved surface convex toward the flow path, and is configured such that the flow path is bent with the curved surface inside.

11. The imprint apparatus according to claim 7, wherein the member is formed with a supply port connected to the flow path, and is configured to cause gas from the supply port to flow out of the inlet port.

12. The imprint apparatus according to claim 7, wherein the member is formed with a supply port connected to the flow path, and is configured to cause gas from the supply port to flow out of the outlet port.

13. The imprint apparatus according to claim 7, wherein a sectional area of the inlet port or the outlet port or each thereof is larger than a sectional area of a flow path between the material supplying device and the substrate.

14. The imprint apparatus according to claim 13, wherein the sectional area of the inlet port or the outlet port or each thereof is not greater than ten times the sectional area of the flow path between the material supplying device and the substrate.

15. The imprint apparatus according to claim 13, wherein the sectional area of the inlet port or the outlet port or each thereof is not greater than twice the sectional area of the flow path between the material supplying device and the substrate.

16. The imprint apparatus according to claim 6, wherein the imprint apparatus configured to form a pattern of the imprint material on the substrate.

17. The imprint apparatus according to claim 16, wherein the flow of gas in the direction toward the material supplying device is along a surface of the substrate,
  wherein the imprint apparatus has an inlet port for the gas among the flow of gas to separate from the substrate for being diverted from the supply path and an outlet port for the gas to return to a position along the substrate after the gas is diverted from the supply path.

18. A method of manufacturing an article, the method comprising steps of:
  forming a pattern on a substrate by using an imprint apparatus; and
  processing the substrate, on which the pattern has been formed, to manufacture the article,
  wherein the imprint apparatus includes:
  a material supplying device configured to supply an imprint material in an imprint region on an substrate;
  a gas supplying device configured to form a flow of gas in a direction toward the material supplying device; and
  a member including a surface facing the substrate and disposed between the material supplying device and the gas supplying device,
  wherein the member is formed with a flow path of the gas such that the gas is diverted from a supply path along which the material supplying device supplies the imprint material in the imprint region.

* * * * *